United States Patent [19]

Beuhler et al.

[11] Patent Number: 4,604,438

[45] Date of Patent: Aug. 5, 1986

[54] HIGH TEMPERATURE THERMOSET TERPOLYMERS

[75] Inventors: Allyson J. Beuhler, Indian Head Park; James A. Wrezel, Buffalo Grove, both of Ill.

[73] Assignee: UOP Inc., Des Plaines, Ill.

[21] Appl. No.: 764,816

[22] Filed: Aug. 12, 1985

[51] Int. Cl.[4] ............................................. C08F 20/32
[52] U.S. Cl. ...................................... 526/262; 526/273
[58] Field of Search ............... 526/262, 273, 280, 293, 526/284, 318.43

[56] References Cited

U.S. PATENT DOCUMENTS

| | | | |
|---|---|---|---|
| 2,510,647 | 6/1950 | Miller | 526/280 |
| 2,851,444 | 9/1958 | Wesp | 526/318.43 |
| 3,052,659 | 9/1962 | Woodruff | 526/273 |
| 3,196,133 | 7/1965 | Piloni | 526/280 |
| 4,054,733 | 10/1977 | Hall | 526/293 |
| 4,255,547 | 3/1981 | Arendt | 526/273 |
| 4,408,012 | 10/1983 | Furuya | 526/262 |

*Primary Examiner*—Paul R. Michl
*Attorney, Agent, or Firm*—Thomas K. McBride; John F. Spears, Jr.; Raymond H. Nelson

[57] ABSTRACT

Novel high temperature thermoset terpolymers may be synthesized by reacting an alpha-substituted olefin, an alpha,beta-disubstituted olefin and a dual function monomer followed by cross-linking the resultant polymer with a low molecular weight multifunctional amine as the cross-linking agent in the presence of a catalyst. The resulting cross-linking agent is then cured at an elevated temperature to provide the desired terpolymer. This compound will possess desirable properties such as a low dielectric constant which renders it applicable for use as circuit board laminates.

26 Claims, No Drawings

HIGH TEMPERATURE THERMOSET TERPOLYMERS

BACKGROUND OF THE INVENTION

With the advent of sophisticated equipment in the electrical and electronic fields, it has become necessary that the components of the various pieces of equipment conform to high standards which are set forth in the specifications for these components. For example, circuit boards which are used in relatively complicated pieces of equipment such as main frame computers must be of a relatively high standard of quality in order to function in an efficient manner for a long period of time without deteriorating or breaking down and thus causing an interruption in the function of the machine. This high quality of material is opposed to pieces of equipment requiring a lower standard of quality such as those used in personal computers, television equipment, radios, etc.

Circuit boards upon which a circuit is etched or implanted usually comprise a laminate which is composed of a synthetic polymeric substance which possesses desirable characteristics such as thermal stability, low coefficient of thermal expansion, dimensional stability, low dielectric constant, solvent resistance, low moisture absorption, etc. and a suitable reinforcement matrix, such as glass, quartz, graphite, Kevlar, etc.

As will hereinafter be shown, it has now been discovered that a polymer which contains three components and which has been cross-linked with an amine may be used as a circuit board matrix material and will possess the desirable characteristics hereinbefore set forth.

BRIEF SUMMARY OF THE INVENTION

This invention relates to thermoset polymers. More specifically, the invention is concerned with a novel high temperature thermoset terpolymer and to a method for the preparation thereof. As was previously mentioned, the terpolymers of the present invention which constitute novel compositions of matter may be formulated into crosslinked, insoluble matrices by curing with hardness and then utilized in circuit board laminates and dielectric coatings, the use thereof being attributable to the desirable characteristics which are possessed by these polymeric compositions of matter.

The particular characteristics of the polymer dielectric and reinforcing components which go to make up the circuit boards contribute to the efficiency and stability of the final electronic equipment in which the circuit boards are used. For example, a lowering of the dielectric constant in the polymer matrix reduces the signal delay time or "crosstalk" and line capacitance. This results in a faster PWB circuitry and in addition provides the potential to increase the number of functions per board. The polymeric matrix of the present invention possesses a lower dielectric constant than that which is possessed by thermosetting polyimide or epoxy matrices which are used as the standards by the industry for electrical laminates.

Another desirable characteristic of a polymer matrix for use in circuit boards is that the coefficient of thermal expansion should be relatively low in order to avoid a mismatch of thermal expansions with the electronic components and the fiberglass reinforcement with which the polymeric matrix is composited. It has been found that the coefficient of expansion of the novel terpolymer of the present invention is comparable to a polyimide matrix. Furthermore, the thermal stability of the polymer matrix must be relatively high in nature inasmuch as the matrix must possess the ability to withstand soldering temperatures without melting or degrading. A desirable characteristic of the terpolymer of the present invention is that the thermal stability of the polymer is variable and can be tailored to fall within a range between that of polyimide and epoxy matrix.

The terpolymer of the present invention when subjected to reaction with a cross-linking agent or hardener results in a high degree of cross-linking which renders the polymer resistant to dissolution or decomposition due to the action of a solvent on the board. This is of particular importance when a solvent such as methylene chloride is employed in the subsequent vapor degreasing process during the soldering stage in copper clad or multilayer boards.

It is therefore an object of this invention to provide a novel high temperature thermoset terpolymer.

Another object of this invention resides in a process for preparing the aforementioned high temperature thermoset terpolymers.

In one aspect an embodiment of this invention resides in a thermoset terpolymer comprising a cross-linked mixture of an alpha-substituted olefin, an alpha,beta-disubstituted olefin and a dual function monomer.

Another embodiment of this invention will be found in a process for the preparation of a thermoset terpolymer which comprises polymerizing an alpha-substituted olefin, an alpha,beta-disubstituted olefin and a dual function monomer at admixing conditions, cross-linking or curing the resultant recovered admixture with a cross-linking agent comprising a low molecular weight multifunctional amine in the presence of a catalyst at curing conditions and recovering the resultant thermoset terpolymer after curing.

A specific embodiment of this invention will be found in a thermoset terpolymer comprising a mixture of styrene, acenaphthylene and glycidyl methacrylate which is cross-linked with dicyandiamide.

Another specific embodiment of this invention is found in a process for the preparation of a thermoset terpolymer which comprises admixing styrene, acenaphthylene, and glycidyl methacrylate at a temperature in the range of from about ambient to about 100° C. and subatmospheric pressure, cross-linking or curing the resultant recovered admixture with a cross-linking agent comprising dicyandiamide in the presence of a catalyst comprising benzyldimethylamine, at a temperature in the range of from about 150° to about 250° C. for a period of time ranging from about 1 to about 40 hours, and recovering the resultant thermoset terpolymer after curing.

Other objects and embodiments will be found in the following detailed description of the invention.

DETAILED DESCRIPTION OF THE INVENTION

As hereinbefore set forth, the present invention is concerned with novel high temperature thermoset terpolymers as well as to a method for preparing these compounds. The terpolymers will comprise a mixture of an alpha-substituted olefin, an alpha,beta-disubstituted olefin and a dual function monomer, said mixture having been cross-linked or cured by treatment with a cross-linking agent comprising a multifunctional primary or secondary amine. By utilizing such an amine which is in a low molecular weight compound, it is possible to obtain a solid composition of matter which is useful in electronic circuitry, said solid matrix possessing a relatively low dielectric constant.

Some examples of alpha-substituted olefins which may be employed as one component of the composition of matter of the present invention will include styrene, halo-substituted styrenes such as o-chlorostyrene, m-chlorostyrene, p-chlorostyrene, o-bromostyrene, m-bromostyrene, p-bromostyrene, o-iodostyrene, m-iodostyrene, p-iodostyrene, vinylnaphthalene, etc. In the preferred embodiment of the invention the second component of the composite comprises an alpha,beta-disubstituted olefin such as acenaphthylene, indene, N-phenylmaleimide, etc. The third component of the composite will comprise a dual function monomer which, again in the preferred embodiment of the invention, comprises glycidyl acrylate, glycidyl methacrylate, etc. It is to be understood that the aforementioned alpha-substituted olefins, alpha,beta-disubstituted olefins and dual functional monomers are only representative of the class of compounds which may be employed to form the desired novel terpolymer, and that the present invention is not necessarily limited thereto.

The desired and novel high temperature thermoset terpolymer may be prepared in any suitable manner of operation including both a continuous and a batch type operation. For example, when a batch type operation is employed, the desired three components of the terpolymer comprising, as hereinbefore set forth, an alpha-substituted olefin, an alpha,beta-disubstituted olefin and a dual function monomer are placed in an appropriate apparatus along with a solvent and a free radical initiator such as 2,2-azobisisobutyronitrile, benzoyl peroxide, etc. The three components of the mixture may be present in the reaction mixture in an amount of from about 20 to about 60 mole percent of alpha-substituted olefin, from about 20 to about 75 mole percent of alpha,beta-disubstituted olefin and from about 5 to about 40 mole percent of the dual function monomer. After admixing the three components of the mixture at mixing conditions which, in the preferred embodiment of the invention, comprise reaction temperatures ranging from ambient (20°-25° C.) to about 100° C. and subatmospheric pressures ranging from about 1 to about 10 mm Hg., the resulting admixture is recovered. The polymer can then be cross-linked by the addition of a cross-linking agent comprising a multifunctional primary or secondary amine in the presence of a 3° amine catalyst such as benzyldimethylamine, benzyldiethylamine, benzyldipropylamine, methyldibenzylamine, ethyl dibenzylamine, 2-methylimidazole, etc. Some examples of these cross-linking agents which also may be employed will include multifunctional primary or secondary amines such as dicyandiamide, methylene dianiline, diaminodiphenyl sulfone, diaminodiphenyl ether, m-phenylenediamine, p-phenylenediamine, 1,3-diaminocyclohexane, 1,4-diaminocyclohexane, substituted 1,2-aliphatic diamines such as diethylenetriamine, triethylenetetramine, tetraethylenepentamine, dipropyltriamine, tripropyltetramine, etc.

The polymer is then subjected to a cure utilizing a graduated curing cycle to fully react the material. The curing conditions which are employed will include temperatures ranging from about 150° to about 250° C. for a period of time which may range from about 1 to about 40 hours or more in duration. For example, the polymer may be cured at a temperature in the lower end of the range such as, for example, 150° C. for a relatively long period of time such as 10 to 24 hours, a shorter period of time at a higher temperature followed by a still shorter period of time at a temperature in the higher portion of the hereinbefore set forth range. At the end of the predetermined cure period, the cross-linked terpolymer is then recovered, and is suitable for use in dielectric coatings or as a laminate in a circuit board.

It is also contemplated within the scope of this invention that the terpolymer may be prepared in a continuous manner of operation. When this type of operation is used, the predetermined amounts of the three components of the mixture are continuously charged to a reaction zone which is maintained at the proper operating conditions of temperature and pressure along with a solvent and free radical initiator. Those skilled in the art will recognize that a continuous reactant charge is necessary, with amounts depending on the individual component reactivity with the other components, to provide high yield of product with consistent molecular structure and quality. After passage through this reaction zone, the polymeric mixture resulting therefrom is continuously charged to a second reaction zone wherein it is contacted with a cross-linking agent and a catalyst of the type previously discussed. After contact with the cross-linking agent, the mixture can be coated on a suitable reinforcement and continuously charged to a curing zone wherein it is subjected to a partial cure by passage through this zone which is maintained at varying operating temperatures for a predetermined period of time. After passage through the zone, the resulting B-stage or prepreg material is continuously withdrawn and passed to storage. The prepreg can then be laid up as sheets with or without copper foil as an electrical or thermal conductor and further cross-linked to a fully cured state.

Examples of high temperature thermoset terpolymers which may be prepared according to the process of this invention will include mixtures of styrene, acenaphthylene and glycidyl methacrylate cross-linked with dicyandiamide; p-bromostyrene, acenaphthylene and glycidyl methacrylate cross-linked with dicyandiamide; p-chlorostyrene, acenaphthylene and glycidyl methacrylate cross-linked with dicyandiamide; styrene, acenaphthylene and glycidyl methacrylate cross-linked with methylene dianiline; p-bromo styrene, acenaphthylene and glycidyl methacrylate cross-linked with methylene dianiline; p-chlorostyrene, acenaphthylene and glycidyl methacrylate cross-linked with methylene dianiline; styrene, acenaphthylene and glycidyl methacrylate cross-linked with diaminodiphenyl sulfone; p-bromostyrene, acenaphthylene and glycidyl methacrylate cross-linked with diaminodiphenyl sulfone; p-chlorostyrene, acenaphthylene and glycidyl methacrylate cross-linked with diaminodiphenyl sulfone; styrene, acenaphthylene and glycidyl methacrylate cross-linked with diaminodiphenyl ether; p-bromostyrene, acenaphthylene and glycidyl methacrylate cross-linked with diaminodiphenyl ether; p-chlorostyrene, acenaphthylene and glycidyl methacrylate cross-linked with diaminodiphenyl ether; styrene, indene and glycidyl methacrylate cross-linked with dicyandiamide; styrene, indene and glycidyl methacrylate cross-linked with methylene dianiline; styrene, indene and glycidyl methacrylate cross-linked with diaminodiphenyl sulfone; styrene, indene and glycidyl methacrylate cross-linked with diaminodiphenyl ether; styrene, acenaphthylene, glycidyl acrylate cross-linked with dicyandiamide; styrene, acenaphthylene, glycidyl acrylate cross-linked with methylene dianiline; styrene, acenaphthylene, glycidyl acrylate cross-linked with diaminodiphenyl sulfone; styrene, acenaphthylene, glycidyl acrylate cross-linked with diaminodiphenyl ether; p-bromostyrene, acenaphthylene and glycidyl acrylate cross-linked with dicyandiamide, p-bromostyrene, acenaphthylene and glycidyl acrylate cross-linked with methylene dianiline, p-bromostyrene, acenaphthylene and glycidyl acrylate cross-linked with diaminodiphenyl sulfone; p-bromostyrene, acenaphthylene and glycidyl acrylate cross-linked with diaminodiphenyl ether; etc. It is to be understood that the aforementioned terpolymers are only representative of the class of high temperature thermoset terpolymers of the present invention and that said invention is not necessarily limited thereto.

The following examples are given for purposes of illustrating terpolymers of the present invention and to a method for the preparation thereof. However, it is to be understood that these examples are only illustrative in nature and that this invention is not necessarily limited thereto.

EXAMPLE I

To a vacuum flask was added 20.0 grams (0.192 mole) of styrene, 11.7 grams (0.077 mole) of acenaphthylene, and 8.3 grams (0.058 mole) of glycidyl methacrylate. Prior to placing the three components of the polymer in the vacuum flask, they were purified by either vacuum distillation (after extraction of inhibitor) or recrystallization. In addition, 30 cc of a solvent comprising toluene and 0.06 grams (0.15 wt. % based on monomer content) of a free radical initiator comprising 2,2-azobisisobutyronitrile were also placed in the flask. The flask was evacuated to 1 mm of mercury and sealed. Following this the flask was heated to a temperature of 90° C. and maintained thereat for a period of 24 hours. At the end of this time the resulting polymer was recovered and purified by reprecipitation from hexane. After recovery the polymer was dried and recovered. Elemental analysis on the recovered product indicated 85.84% C, 6.59% H and 6.61% O. Epoxide equivalent weight (HBr titration) was 643 gram per mole epoxide. Number-average molecular weight was 36,100 and weight-average molecular weight was 84,500 for the recovered polymers. Differential scanning calorimetry revealed a glass transition temperature of 154° C. for the recovered product.

The polymer (20 g) in the form of a solid powder was then placed in a second flask along with 70 cc of a solvent comprising N,N-dimethylformamide, 0.30 grams of a 3° amine catalyst comprising benzyldimethylamine and 0.52 g of a cross-linking agent comprising dicyandiamide (epoxide/amine H=1.25/1). The resin solution was coated on glass cloth reinforcement and cured using a graduated cure cycle which included 80 minutes at 170° C. and 30–45 minutes at 200° C. The final cross-linked product had a Tg of 205° C. Further testing of this cross-linked polymer without glass cloth reinforcement showed a thermal mechanical analysis (TMA) softening point of 237° C., thermal expansivity (30°–260° C.) of 54 ppm per °C. (linear), dielectric constant of 2.82 and dissipation factor of 0.007 at 1MH$_z$.

EXAMPLE II

A second polymer was prepared by varying the amounts of acenaphthylene and glycidyl methacrylate. This polymer was prepared by purifying the three components as mentioned in Example 1 and thereafter adding 20.0 grams (0.192 mole) of styrene, 14.2 grams (0.093 mole) of acenaphthylene and 14.9 grams (0.105 mole) of glycidyl methacrylate to a vacuum flask in the presence of 30 cc of toluene and 0.07 grams of 2,2-azobisisobutyronitrile. The mixture was treated in the vacuum flask in a manner similar to that set forth in Example I above.

Elemental analysis on the recovered product indicated 83.40% C, 6.67% H and 8.71% O. Epoxide equivalent weight (HBr titration) was 493 g resin per mole epoxide. Number-average molecular weight was 50,800 and weight-average molecular weight was 123,500 for the recovered polymer. Differential scanning calorimetry revealed a Tg of 145° C. for the recovered polymer. After recovering the polymer, it was cross-linked by treatment with a cross-linking agent comprising dicyandiamide and a catalyst comprising benzyldimethylamine and also in a manner similar to that set forth above. The recovered cross-linked thermoset material exhibited a Tg of 218° C. Thermal mechanical analysis of the cross-linked polymer without reinforcement matrix indicated a softening point of 202° C. (thermal expansivity of 51 ppm per °C. (linear)) and a dielectric constant of 3.08 and dissipation factor of 0.011 at 1 MH$_z$.

EXAMPLE III

In this example, 70.0 grams (0.380 mole) of p-bromostyrene, 24.0 grams (0.160 mole) of acenaphthylene and 9.0 grams (0.060 mole) of glycidyl methacrylate after purification were placed in a vacuum flask along with 300 cc of toluene and 0.20 grams of a free radical initiator comprising 2,2-azobisisobutyronitrile. The contents of the flask were evacuated to 1 mm Hg and thereafter the flask was heated at a temperature of 90° C. for a period of 24 hours. At the end of this period heating was discontinued and after the flask was returned to room temperature and atmospheric pressure, the resulting polymer was recovered and reprecipitated from hexane.

After separation from the hexane and drying, the solid powder (10.0 grams) was then placed in a second flask along with 0.090 grams of a cross-linking agent comprising dicyandiamide and 0.30 grams of a 3° amine catalyst comprising benzyldimethylamine, and 50 cc of a solvent comprising N,N-dimethylformamide. The polymer solution was poured into a mold and subjected to a cure cycle which comprised 80 minutes at 170° C., and 2 hours at 200° C.

The resulting cross-linked thermoset terpolymer in the form of a resin casting was found to have a dielectric constant of 2.75 and a dissipation factor of 0.014 at 1MH$_z$. In addition, differential scanning calorimetry showed a Tg of 169° C. for the polymer prior to cross-linking and a Tg of 209° C. subsequent to cross-linking.

EXAMPLE IV

In a like manner other thermoset terpolymers were prepared by admixing alpha-substituted olefins such as o-chlorostyrene, p-chlorostyrene, o-bromostyrene or vinylnaphthylene with an alpha,beta-disubstituted olefin such as indene and a dual function monomer such as glycidyl methacrylate in the presence of a free radical initiator such as benzoyl peroxide under vacuum followed by cross-linking with a cross-linking agent such as methylene dianiline, diaminodiphenyl sulfone, diaminodiphenyl ether in the presence of a catalyst and a solvent such as N,N-dimethylformamide at elevated temperatures and for a period of time similar to that set forth in the above examples to form a high temperature thermoset terpolymer which may be used in the electronic or electrical industry.

We claim as our invention:

1. A thermoset terpolymer comprising a cross-linked mixture of
   (a) an alpha-substituted olefin selected from the group consisting of styrene, o-chlorostyrene, p-chlorostyrene, o-bromostyrene, p-bromostyrene, o-iodostyrene, m-iodostyrene, p-iodostyrene and vinylnaphthylene;
   (b) an alpha, beta-disubstituted olefin selected from the group consisting of acenaphthylene, indene and N-phenylmaleimide; and
   (c) a dual function monomer selected from the group consisting of glycidyl acrylate and glycidyl methacrylate.

2. A process for the preparation of a thermoset terpolymer which comprises polymerizing at polymerization conditions
   (a) an alpha-substituted olefin selected from the group consisting of styrene, o-chlorostyrene, p-chlorostyrene, o-bromostyrene, p-bromostyrene, o-iodostyrene, m-iodostyrene, p-iodostyrene and vinylnaphthylene;
   (b) an alpha, beta-disubstituted olefin selected from the group consisting of acenaphthylene, indene and N-phenylmaleimide; and
   (c) a dual function monomer selected from the group consisting of glycidyl acrylate and glycidyl methacrylate;
   cross-linking the resultant admixture with a cross-linking agent comprising a low molecular weight multifunctional amine in the presence of a catalyst, at curing conditions, and recovering the resultant thermoset terpolymer.

3. The thermoset terpolymer as set forth in claim 1 in which said cross-linking agent comprises a low molecular weight multifunctional amine.

4. The thermoset terpolymer as set forth in claim 3 in which said low molecular weight multifunctional amine is dicyandiamide.

5. The thermoset terpolymer as set forth in claim 3 in which said low molecular weight multifunctional amine is methylene dianiline.

6. The thermoset terpolymer as set forth in claim 3 in which said low molecular weight multifunctional amine is diaminodiphenyl sulfone.

7. The thermoset terpolymer as set forth in claim 1 in which said terpolymer contains from about 20 to about 60 mole percent of alpha-substituted olefin.

8. The thermoset terpolymer as set forth in claim 1 in which said terpolymer contains from about 20 to about 75 mole percent of alpha,beta-disubstituted olefin.

9. The thermoset terpolymer as set forth in claim 1 in which said terpolymer contains from about 5 to about 25 mole percent of a dual function monomer.

10. The thermoset terpolymer as set forth in claim 1 in which said terpolymer comprises a mixture of styrene, acenaphthylene and glycidyl methacrylate cross-linked with dicyandiamide.

11. The thermoset terpolymer as set forth in claim 1 in which said terpolymer comprises a mixture of p-bromostyrene, acenaphthylene and glycidyl methacrylate cross-linked with dicyandiamide.

12. The thermoset terpolymer as set forth in claim 1 in which said terpolymer comprises a mixture of styrene, indene and glycidyl methacrylate cross-linked with dicyandiamide.

13. The thermoset terpolymer as set forth in claim 1 in which said terpolymer comprises a mixture of p-chlorostyrene, acenaphthylene and glycidyl acrylate cross-linked with methylene dianiline.

14. The thermoset terpolymer as set forth in claim 1 in which said terpolymer comprises a mixture of o-chlorostyrene, indene and glycidyl methacrylate cross-linked with diaminodiphenyl sulfone.

15. The process as set forth in claim 2 in which said polymerization conditions include a temperature in the range of from about ambient to about 100° C. and a subatmospheric pressure.

16. The process as set forth in claim 2 in which said curing conditions include temperatures in the range of from about 150° to about 250° C. for a period of time ranging from about 1 to about 40 hours.

17. The process as set forth in claim 2 in which said catalyst comprises a Lewis base.

18. The process as set forth in claim 23 in which said Lewis-based catalyst comprises benzyldimethylamine.

19. The process as set forth in claim 2 in which said cross-linking agent comprises dicyandiamide.

20. The process as set forth in claim 2 in which said cross-linking agent comprises methylene dianiline.

21. The process as set forth in claim 2 in which said cross-linking agent comprises diaminodiphenyl sulfone.

22. The process as set forth in claim 2 in which said resultant thermoset terpolymer comprises a mixture of styrene, acenaphthylene and glycidyl methacrylate cross-linked with dicyandiamide.

23. The process as set forth in claim 2 in which said resultant thermoset terpolymer comprises p-bromostyrene, acenaphthylene and glycidyl methacrylate cross-linked with dicyandiamide.

24. The process as set forth in claim 2 in which said resultant thermoset terpolymer comprises styrene, indene and glycidyl methacrylate cross-linked with dicyandiamide.

25. The process as set forth in claim 1 in which said resultant thermoset terpolymer comprises a mixture of p-chlorostyrene, acenaphthylene and glycidyl methacrylate cross-linked with methylene dianiline.

26. The process as set forth in claim 1 in which said resultant thermoset terpolymer comprises a mixture of o-chlorostyrene, indene and glycidyl methacrylate cross-linked with diaminodiphenyl sulfone.

* * * * *